United States Patent
Kosakai

(10) Patent No.: US 10,079,167 B2
(45) Date of Patent: Sep. 18, 2018

(54) ELECTROSTATIC CHUCKING DEVICE

(71) Applicant: SUMITOMO OSAKA CEMENT CO., LTD., Tokyo (JP)

(72) Inventor: Mamoru Kosakai, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/528,008

(22) PCT Filed: Nov. 11, 2015

(86) PCT No.: PCT/JP2015/081732
§ 371 (c)(1),
(2) Date: May 18, 2017

(87) PCT Pub. No.: WO2016/080262
PCT Pub. Date: May 26, 2016

(65) Prior Publication Data
US 2017/0323819 A1 Nov. 9, 2017

(30) Foreign Application Priority Data
Nov. 20, 2014 (JP) .................................. 2014-235455

(51) Int. Cl.
H01T 23/00 (2006.01)
H01L 21/683 (2006.01)
H01L 21/67 (2006.01)

(52) U.S. Cl.
CPC .... *H01L 21/6833* (2013.01); *H01L 21/67103* (2013.01)

(58) Field of Classification Search
CPC .................................................. H01L 21/6833
See application file for complete search history.

(56) References Cited

U.S. PATENT DOCUMENTS 5,886,863 A 3/1999 Nagasaki et al.
6,180,241 B1 * 1/2001 Suhir ...................... H01L 23/16
156/242

(Continued)

FOREIGN PATENT DOCUMENTS

JP 04-287344 A 10/1992
JP 05-347352 A 12/1993

(Continued)

OTHER PUBLICATIONS

International Search Report for PCT/JP2015/081732 (dated Jan. 26, 2016).

(Continued)

*Primary Examiner* — Stephen W Jackson
(74) *Attorney, Agent, or Firm* — Merchant & Gould P.C.

(57) ABSTRACT

Provided is an electrostatic chucking device having high heat resistance. The electrostatic chucking device of the present invention includes a first ceramic plate which includes a first surface on which a substrate is able to be placed and a second surface on the opposite side thereof, and in which an internal electrode for electrostatic adsorption is embedded; a heating member fixed to the second surface; a second ceramic plate adhered to the first ceramic plate and the heating member via a first adhesive layer; and a cooling base portion adhered to the second ceramic plate via a second adhesive layer and cools at least the second ceramic plate. The first adhesive layer has a higher heat resistance than the second adhesive layer. The second adhesive layer has a smaller Young's modulus than the first adhesive layer.

9 Claims, 6 Drawing Sheets

(56) References Cited

U.S. PATENT DOCUMENTS

| | | | |
|---|---|---|---|
| 8,981,263 B2* | 3/2015 | Sasaki | H01L 21/6831 118/725 |
| 9,269,600 B2* | 2/2016 | Miura | H01L 21/67103 |
| 9,287,156 B2* | 3/2016 | Moriya | H01L 21/6833 |
| 2014/0154819 A1 | 6/2014 | Gaff et al. | |

FOREIGN PATENT DOCUMENTS

| | | |
|---|---|---|
| JP | 2003-258065 A | 9/2003 |
| JP | 2005-200281 A | 7/2005 |
| JP | 3978011 B2 | 9/2007 |
| JP | 2007-317772 A | 12/2007 |
| JP | 2012-248693 A | 12/2012 |
| JP | 5116855 B2 | 1/2013 |
| JP | 2013-074251 A | 4/2013 |
| JP | 2013-247342 A | 12/2013 |
| JP | 2013-258268 A | 12/2013 |
| JP | 2014-078731 A | 5/2014 |
| JP | 5504924 B2 | 5/2014 |
| JP | 2014-112672 A | 6/2014 |

OTHER PUBLICATIONS

Notice of Allowance for Japanese Patent Application No. 2015-561818 (dated Jun. 6, 2017).

* cited by examiner

ELECTROSTATIC CHUCKING DEVICE

TECHNICAL FIELD

The present invention relates to an electrostatic chucking device.

The present application is a National Stage Application under 35 U.S.C. § 371 of International Application No. PCT/JP2015/081732 filed Nov. 11, 2015, which claims the benefit of priority to Japanese Patent Application No. 2014-235455, filed on Nov. 20, 2014,the disclosures of all of which are hereby incorporated by reference in their entireties. The International Application was published in Japanese on May 26, 2016 as WO 2016/080262.

BACKGROUND

In the related art, in semiconductor manufacturing apparatuses using plasma, such as a plasma etching apparatus, a plasma CVD apparatus, and the like, an electrostatic chucking device has been used as an apparatus in which a wafer is simply attached and fixed to a sampling stage and the wafer is maintained at a desired temperature.

For example, there is a known electrostatic chucking device in which a ceramic substrate internally equipped with a flat electrode for electrostatic adsorption, and a base portion having an internally-formed refrigerant flow channel for refrigerant circulation are joined and integrated together by an adhesive layer (for example, Patent Literature No. 1).

Generally, a service temperature of such an electrostatic chucking device is 200° C. or less (for example, Patent Literature No. 2 and Patent Literature No. 3). For example, Patent Literature No. 3 discloses a silicone-based resin composition as an adhesive layer which can be used in a temperature region of 200° C. or less.

In accordance with improvement of various types of performance of semiconductors in recent years, the electrostatic chucking device is also required to have advanced features. As one of the demands, there is a demand for an electrostatic chucking device which can be used at a high temperature of 200° C. or more.

CITATION LIST

Patent Literature

[Patent Literature No. 1] Japanese Laid-open Patent Publication No. 2013-247342
[Patent Literature No. 2] Japanese Laid-open Patent Publication No. 2005-200281
[Patent Literature No. 3] Japanese Laid-open Patent Publication No. H4-287344

SUMMARY OF INVENTION

Technical Problem

However, an adhesive layer which has a heat resistance to a high temperature region has a problem of a lack of flexibility. A base portion, a ceramic substrate and the adhesive layer causing the base portion and the ceramic substrate to be adhered to each other expand or contract due to heating of a heating member and plasma, a cooling function of the base portion, and the like. Therefore, stress is generated between the base portion and the ceramic substrate due to the difference between thermal expansion coefficients of these members. Due to the stress thereof, the ceramic substrate cannot be sufficiently fixed to the base portion, thereby resulting in positional misalignment and the like.

Meanwhile, a flexible adhesive layer having no heat resistance to a high temperature region is not sufficient in heat resistance. Therefore, for example, under a high temperature environment such as 200° C. or more, the adhesive layer melts or is decomposed. Therefore, even in a case where an adhesive layer having an insufficient heat resistance is used, the ceramic substrate cannot be sufficiently fixed to the base portion, thereby resulting in positional misalignment and the like.

In addition, the insufficient heat resistance of the adhesive layer also causes deterioration of the adhesive layer. When the adhesive layer deteriorates, a difference of a thermal conduction coefficient is generated in the deteriorated portion, thereby lowering the uniformity of an in-plane temperature. Here, "the heat resistance of the adhesive layer" denotes that the adhesive layer does not melt or is decomposed with respect to applied heat and can be retained in a uniform state. For example, "an adhesive layer having a heat resistance of 200° C. or more" denotes that the adhesive layer does not melt or is decomposed even at the temperature of 200° C.

The present invention has been made in consideration of the foregoing problems and aims to provide an electrostatic chucking device which can be used even under a high temperature environment and has a high heat resistance.

Solution to Problem

According to an aspect of the present invention, there is provided an electrostatic chucking device including a first ceramic plate which includes a first surface on which a plate-shaped sample is able to be placed and a second surface on the opposite side thereof, and in which an internal electrode for electrostatic adsorption is embedded; a heating member fixed to the second surface; a second ceramic plate adhered to the first ceramic plate and the heating member via a first adhesive layer; and a cooling base portion adhered to the second ceramic plate via a second adhesive layer. In addition, the first adhesive layer has a higher heat resistance than the second adhesive layer. The second adhesive layer has a smaller Young's modulus than the first adhesive layer.

In this configuration, adhesive interfaces of the first ceramic plate and the second ceramic plate which are closest to the heating member and become high in temperature are adhered to each other through the first adhesive layer having a high heat resistance. Therefore, even under a high temperature environment, the first adhesive layer can be restrained from deteriorating. That is, there is no occurrence of a problem in that in-plane uniformity of temperature is degraded. In addition, since each of the first ceramic plate and the second ceramic plate is made of ceramic, there is no significant difference between the thermal expansion coefficients thereof. Therefore, even if the first ceramic plate and the second ceramic plate are adhered to each other via the first adhesive layer lacking in flexibility, the first ceramic plate and the second ceramic plate do not peel off from each other. Meanwhile, an adhesive interface between the second ceramic plate which is far from the heating member and close to the cooling base portion, and the cooling base portion is adhered through the second adhesive layer having flexibility. Since heat generated in the heating member is transferred to the second adhesive layer via the first adhesive layer and the second ceramic plate, the temperature is sufficiently lowered at a stage of being transferred to the second adhesive layer. As the result thereof, even if the second adhesive layer having a lower heat resistance than the first adhesive layer is used, the second adhesive layer can be restrained from deteriorating without melting or being decomposed. In addition, the Young's modulus of the second adhesive layer is smaller than the Young's modulus of the first adhesive layer. That is, even if the difference between the thermal expansion coefficients of the second ceramic plate and the cooling base portion is significant, stress can be sufficiently relaxed, and the interfaces can be restrained from peeling.

Therefore, by using the configuration described above, there can be provided an electrostatic chucking device which can be used even under a high temperature environment and has a high heat resistance.

In the electrostatic chucking device according to the aspect of the present invention, the first and second adhesive layers may have heat transfer coefficients which are ½ or less of the heat transfer coefficient of the second ceramic plate.

According to the configuration, heat transfer properties in an in-plane direction parallel to a placement surface of the electrostatic chucking device and in the vertical direction can have anisotropy. In order to enhance temperature uniformity of the plate-shaped sample to be placed, the electrostatic chucking device is required to be uniformly heated in the in-plane direction. Meanwhile, in regard to the vertical direction, the demand for efficient exhaust of heat generated in the heating member and the contrary demand for a not-excessively high temperature of the second adhesive layer are required to be compatible. When the heat transfer coefficients of the first and second adhesive layers are low, generated heat is unlikely to be transferred between the first and second adhesive layers and the second ceramic plate. That is, the temperature of the second adhesive layer can be restrained from being a high temperature. In contrast thereto, when the heat transfer coefficient of the second ceramic plate is high, it is possible to enhance the improvement of the temperature uniformity according to the heat transfer in the in-plane direction and the improvement of the heat exhaust properties of generated heat.

In the electrostatic chucking device according to the aspect of the present invention, the cooling base portion may have a first recess portion. At least the first adhesive layer and the second ceramic plate may be fitted therein.

According to the configuration, even if there is a difference between the thermal expansion coefficients of the first ceramic plate and the second ceramic plate, and the cooling base portion, an occurrence of positional misalignment and the like can be restrained due to the fitted state. In addition, in steps of etching and the like, the first adhesive layer and the second adhesive layer can be restrained from being exposed to a surface irradiated with plasma, and the first adhesive layer and the second adhesive layer can be restrained from being consumed due to deterioration or the like.

In the electrostatic chucking device according to the aspect of the present invention, the first ceramic plate may have a bank portion surrounding the second surface. The second ceramic plate may be fitted, via the first adhesive layer, in a second recess portion formed by the bank portion and the second surface.

According to the configuration, the heating member and the first adhesive layer can avoid being in direct contact with the cooling base portion. By causing the portions becoming high in temperature to avoid being in direct contact with the cooling base portion, the temperature uniformity can be enhanced. In addition, by causing the first ceramic plate and the second ceramic plate to be fitted with respect to the cooling base portion in two stages, positional misalignment and the like can be further restrained from occurring. Moreover, in the steps of etching and the like, exposure of the first adhesive layer and the second adhesive layer with respect to the surface irradiated with plasma is reduced, and the first adhesive layer and the second adhesive layer can be restrained from being consumed due to deterioration or the like.

In the electrostatic chucking device according to the aspect of the present invention, a plurality of auxiliary heating members may be fixed to a surface of the second ceramic plate in which the surface of the second ceramic plate is on the side of the first ceramic plate. A temperature of each of the auxiliary heating members may be able to be individually controlled.

According to the configuration, uneven heating occurring in the heating member can be compensated by the auxiliary heating members. That is, the temperature uniformity of the electrostatic chucking device can be enhanced.

In the electrostatic chucking device according to the aspect of the present invention, the heating member may include a plurality of separated members and each of the separated members may be able to be individually driven. In addition, the second ceramic plate may be divided heat-conductively in accordance with a region in which a temperature of each of the separated heating members is able to be individually controlled.

According to the configuration, the temperature of each of the separated heating members can be controlled for each region, and the temperature uniformity of the electrostatic chucking device can be enhanced. In addition, when the second ceramic plate is thermally divided in accordance with the region, heat is restrained from being conductive in the in-plane direction via the second ceramic plate, and the temperature controllability for each region can be further enhanced. Particularly, in the in-plane direction of the electrostatic chucking device, thermal conduction in a concentric circle direction (the circumferential direction) is allowed. However, thermal conduction in a radial direction can cause hindrance to the temperature uniformity. Therefore, it is preferable that the region is divided into concentric circular shapes.

In the electrostatic chucking device according to the aspect of the present invention, a third adhesive layer may be interposed between the second ceramic plate and the second adhesive layer. The third adhesive layer may have a higher heat resistance than the second adhesive layer. In addition, one or more ceramic plates may be interposed between the second ceramic plate and the second adhesive layer.

According to the configuration, heat transfer in the vertical direction with respect to the placement surface of the electrostatic chucking device can be restrained, and the second adhesive layer can avoid being high in temperature. When the second adhesive layer is not caused to be high in temperature, the heat resistance of the second adhesive layer can be maintained, and an occurrence of positional misalignment and the like or deterioration of the second adhesive layer can be restrained. In addition, the third adhesive layer is considered to be higher in temperature than the second adhesive layer, and it is preferable that third adhesive layer has a higher heat resistance than the second adhesive layer. Moreover, in a case where one or more ceramic plates are interposed, it is preferable that each of the ceramic plates is joined via the third adhesive layer or the like having a higher heat resistance than the second adhesive layer.

Advantageous Effects of Invention

According to the electrostatic chucking device of the present invention, it is possible to provide an electrostatic chucking device which can be used at a high temperature of 200° C. or more and of which the heat resistance is enhanced.

DESCRIPTION OF EMBODIMENTS

Hereinafter, electrostatic chucking devices to which the present invention is applied will be described in detail with reference to a suitable drawing.

In order to make the characteristics of the present invention easy to be understood, there are cases where characterized portions of the drawings used in the description below are enlarged and illustrated for convenience, and the dimensional ratio and the like of the each of the configuration elements is different from the actual dimensional ratio. In addition, the materials, the dimensions, and the like illustrated in the description below are examples. The present invention is not limited thereto and can be executed by being suitably changed within a range in which the gist thereof is not changed.

(First Embodiment)

Figure 1:
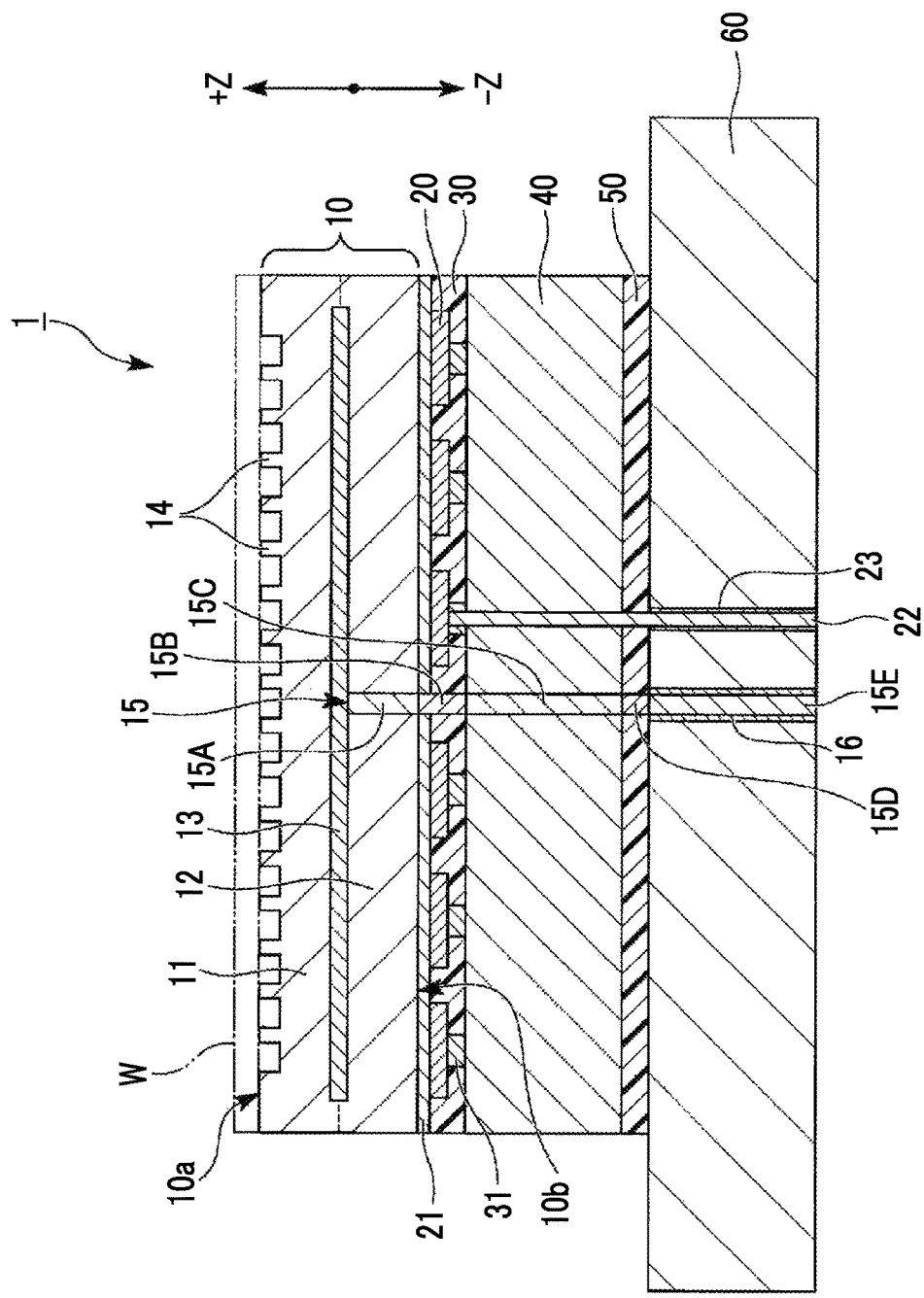
FIG. 1 is a cross-sectional view schematically illustrating an electrostatic chucking device of a first embodiment.

FIG. 1 is a cross-sectional view schematically illustrating an electrostatic chucking device 1 of a first embodiment.

The electrostatic chucking device 1 according to the first embodiment has a first surface 10a on which a plate-shaped sample W can be placed and a second surface 10b on the opposite side thereof, and has a first ceramic plate 10 in which an internal electrode 13 for electrostatic adsorption is embedded, a heating member 20 fixed to the second surface 10b, a second ceramic plate 40 adhered to the first ceramic plate 10 and the heating member 20 via a first adhesive layer 30, and a cooling base portion 60 adhered to the second ceramic plate 40 via a second adhesive layer 50. That is, the electrostatic chucking device 1 has a structure in which the cooling base portion 60, the second adhesive layer 50, the second ceramic plate 40, the first adhesive layer 30, the heating member 20, and the first ceramic plate 10 are stacked in order in the positive-Z direction of FIG. 1.

Hereinafter, based on FIG. 1, the configuration of each portion will be described in detail.

<First Ceramic Plate>

The first ceramic plate 10 has a placement plate 11 on which the plate-shaped sample W such as a semiconductor wafer, a metal wafer, a glass base material, and the like are placed; a supporting plate 12 disposed so as to face the placement plate 11; and the internal electrode 13 for electrostatic adsorption interposed between the placement plate 11 and the supporting plate 12.

In addition, the first ceramic plate 10 has the first surface 10a on which the plate-shaped sample W is placed, and the second surface 10b on the opposite side thereof.

The placement plate 11 and the supporting plate 12 are disk-shaped plates of which the superimposed surfaces have the same shapes and are preferably made of insulative ceramic sintered bodies which have mechanical strength and durability with respect to corrosive gas and plasma thereof, such as a composite sintered body of aluminum oxide-silicon carbide ($Al_2O_3$—SiC), a sintered body of aluminum oxide ($Al_2O_3$), a sintered body of aluminum nitride (AlN), a sintered body of yttrium oxide ($Y_2O_3$), and the like.

A plurality of projection portions 14 may be provided on the first surface 10a of the placement plate 11. When gas circulates among the projection portions 14, it is possible to enhance in-plane uniformity of temperature of a placed plate-shaped sample W due to a flow of the gas. The projection portion 14 has an approximately truncated cone shape and is not limited to the shape. For example, a cross section thereof may have a rectangular shape or a triangular shape.

The supporting plate 12 is provided with a hole penetrating the supporting plate 12 in the thickness direction. An internal electrode terminal 15 is inserted through the hole.

The internal electrode 13 for electrostatic adsorption is used as an electrode for electrostatic chucking generating an electric charge and fixing the plate-shaped sample W by using an electrostatic adsorption force, and the shape or the size thereof is suitably adjusted depending on the purpose thereof.

The material of the internal electrode 13 for electrostatic adsorption is selected in consideration of the difference of thermal expansion, heat resistance, and the like with respect to the materials used as the placement plate 11 and the supporting plate 12. For example, as the internal electrode 13 for electrostatic adsorption, it is possible to use conductive ceramic such as a conductive composite sintered body of aluminum oxide-tantalum carbide ($Al_2O_3$—$Ta_4C_5$), a conductive composite sintered body of aluminum oxide-tungsten ($Al_2O_3$—W), a conductive composite sintered body of aluminum oxide-silicon carbide ($Al_2O_3$—SiC), a conductive composite sintered body of aluminum nitride-tungsten (AlN—W), a conductive composite sintered body of aluminum nitride-tantalum (AlN—Ta), a conductive composite sintered body of yttrium oxide-molybdenum ($Y_2O_3$—Mo), and the like; high-melting metal such as tungsten (W), tantalum (Ta), molybdenum (Mo), and the like; silver (Ag); carbon (C); or the like.

The thickness of the internal electrode 13 for electrostatic adsorption is not particularly limited and is preferably 0.1 µm or more and 100 µm or less and is more preferably 5 µm or more and 20 µm or less.

When the thickness falls below 0.1 µm, sufficient conductivity cannot be ensured. Meanwhile, when the thickness exceeds 100 µm, due to the difference between the thermal expansion coefficients of the internal electrode 13 for electrostatic adsorption and the placement plate 11, and the supporting plate 12, a crack is likely to be generated in a joint interface of the internal electrode 13 for electrostatic adsorption and the placement plate 11, and the supporting plate 12.

The internal electrode 13 for electrostatic adsorption having such a thickness can be easily formed through a film-forming method such as a sputtering method, a vapor deposition method, and the like; or a coating method such as a screen printing method and the like.

The internal electrode terminal 15 is provided in order to apply a DC voltage to the internal electrode 13 for electrostatic adsorption. The internal electrode terminal 15 includes a lead electrode 15A, a first conductive adhesive material 15B, a first extraction electrode 15C, a second conductive adhesive material 15D, and a second extraction electrode 15E. The internal electrode terminal 15 is inserted through the hole from the internal electrode 13 for electrostatic adsorption, extends in the thickness direction, and is exposed to a surface on the opposite side of a surface of the cooling base portion 60 on the first ceramic plate 10 side. In addition, the internal electrode terminal 15 is insulated by an insulator 16 with respect to at least the cooling base portion 60.

In the internal electrode terminal 15, the materials of the lead electrode 15A, the first extraction electrode 15C, and the second extraction electrode 15E are not particularly limited as long as the materials are conductive and have excellent heat resistance. A material of which the thermal expansion coefficient is approximated to the thermal expansion coefficients of the internal electrode 13 for electrostatic adsorption, the supporting plate 12, and the second ceramic plate described below is preferable. For example, conductive ceramic configuring the internal electrode 13 for electrostatic adsorption, or a metal material such as tungsten (W), tantalum (Ta), molybdenum (Mo), niobium (Nb), a Kovar alloy, and the like is preferably used. The first conductive adhesive material 15B is required to have a heat resistance. Therefore, a polyimide resin to which conductivity is applied by using a conductive filler or the like, and the like can be preferably used. Since the second conductive adhesive material 15D is required to have flexibility, a silicone resin to which conductivity is applied by using the conductive filler or the like, and the like can be preferably used. In this manner, the lead electrode 15A, the first extraction electrode 15C, and the second extraction electrode 15E are connected through the first conductive adhesive material 15B and the second conductive adhesive material 15D. Accordingly, the internal electrode terminal 15 can be restrained from escaping from the internal electrode 13 for electrostatic adsorption due to thermal stress.

It is preferable that the thickness of the first ceramic plate 10 is 0.7 mm or more and 5.0 mm or less. When the thickness of the first ceramic plate 10 falls below 0.7 mm, mechanical strength of the first ceramic plate 10 cannot be ensured. Meanwhile, when the thickness of the first ceramic plate 10 exceeds 5.0 mm, the thermal capacity of the first ceramic plate 10 excessively increases, and thermal responsiveness of a placed plate-shaped sample W deteriorates. Moreover, due to an increase of thermal conduction of the first ceramic plate 10 in the lateral direction, it becomes difficult to maintain the in-plane temperature of the plate-shaped sample W in a desired temperature pattern. Particularly, it is preferable that the thickness of the placement plate 11 is 0.3 mm or more and 2.0 mm or less. When the thickness of the placement plate 11 falls below 0.3 mm, there is a high risk of a discharge caused due to a voltage applied to the internal electrode 13 for electrostatic adsorption. Meanwhile, when exceeding 2.0 mm, the plate-shaped sample W cannot be sufficiently adsorbed and fixed, and it becomes difficult to sufficiently heat the plate-shaped sample W.

<Heating Member>

The heating member 20 is arranged and fixed in a predetermined pattern on the second surface 10b of the first ceramic plate 10 via an adhesive layer 21. The heating member 20 is one continuous belt-shaped member in which a belt-shaped metal material having a narrow width meanders. A power supply terminal 22 illustrated in FIG. 1 is connected to both end portions of the belt-shaped member through welding or the like, and the power supply terminal 22 is insulated by an insulator 23 with respect to the insulative cooling base portion 60. The power supply terminal 22 has a flexible structure portion (illustration omitted) formed of metal strand wires or the like which can relax the difference between the thermal expansions of the second ceramic plate 40 and the cooling base portion 60.

The heating member 20 may be configured with one belt-shaped member and may be formed of a plurality of members which are separated and independent from each other. For example, in a case where the electrostatic chucking device 1 is divided into regions such as a central portion having a concentric circular shape, an intermediate portion, a peripheral portion, and the like with respect to a circular placement surface thereof, it is preferable that the heating member 20 is separated into three members such as a central heating member, an intermediate heating member, and a peripheral heating member respectively in accordance with the regions so as to be independently controlled. According to the configuration, the temperature of the plate-shaped sample W can be freely controlled for each region during the process. In this case, both the end portions of each of the members require the power supply terminal.

The heating member 20 has a thickness of 0.2 mm or less and preferably has a uniform thickness of 0.1 mm or less.

When the thickness of the heating member 20 exceeds 0.2 mm, the pattern shape of the heating member 20 is reflected as the temperature distribution of the plate-shaped sample W, and it becomes difficult to maintain the in-plane temperature of the plate-shaped sample W in a desired temperature pattern.

In addition, when the heating member 20 has a uniform thickness, the calorific value of the heating member 20 can also be uniform in the entire region of the heating surface. Accordingly, the temperature distribution on the first surface 10a of the first ceramic plate 10 can be uniform.

The heating member 20 is preferably made of a nonmagnetic metal thin plate and, for example, can be formed by performing etching of a titanium (Ti) thin plate, a tungsten (W) thin plate, a molybdenum (Mo) thin plate, and the like in a desired heater pattern through a photolithographic method.

When the heating member 20 is formed of nonmagnetic metal, even if the electrostatic chucking device 1 is used in a high-frequency atmosphere, there is no self-heating of the heating member 20 due to high-frequency waves. Therefore, even in a high-frequency atmosphere, it is easy to maintain the in-plane temperature of the plate-shaped sample W at a desired uniform temperature or a uniform temperature pattern.

The adhesive layer 21 may be provided across the entire surface of the second surface 10b of the first ceramic plate 10 and may be provided in only the interface between the heating member 20 and the first ceramic plate 10.

The adhesive layer 21 is an adhesive resin having a sheet shape or a film shape. The adhesive layer 21 is a portion which is indirect contact with the heating member 20, which is required to have a high heat resistance for high heat of 200° C. or more, and which is preferably insulative. Therefore, a polyimide resin or the like can be employed.

The thickness of the adhesive layer 21 is preferably 5 μm or more and 100 μm or less and is more preferably 10 μm or more and 50 μm or less. In a case where the thickness of the adhesive layer 21 is 10 μm or more, it is preferable that the unevenness of the in-plane thickness of the adhesive layer 21 is within 10 μm. When the unevenness of the in-plane thickness of the adhesive layer 21 exceeds 10 μm, unevenness exceeding 10 μm is generated in an in-plane gap between the first ceramic plate 10 and the heating member 20. As the result thereof, the in-plane uniformity of heat transferred from the heating member 20 to the first ceramic plate 10 is degraded, and there is a possibility that the in-plane temperature on the placement surface of the first ceramic plate 10 is not uniform.

<First Adhesive Layer>

The first adhesive layer 30 is interposed between the first ceramic plate 10, and the heating member 20 and the second ceramic plate 40. The first adhesive layer 30 causes the first ceramic plate 10, and the heating member 20 and the second ceramic plate 40 to be adhered and integrated together. In addition, the first adhesive layer 30 relaxes thermal stress generated in the interface between the first ceramic plate 10, and the heating member 20 and the second ceramic plate 40 caused due to the difference between the thermal expansion coefficients of the first ceramic plate 10, and the heating member 20 and the second ceramic plate 40.

The first adhesive layer 30 has a higher heat resistance than the second adhesive layer. As a specific value of the heat resistance of the first adhesive layer 30, it is preferable to have a heat resistance of 200° C. or more, it is more preferable to have a heat resistance of 250° C. or more, and it is further more preferable to have a heat resistance of a 300° C. or more. The first adhesive layer 30 is directly adhered to the heating member 20, thereby being high in temperature sometimes. When the first adhesive layer 30 has a high heat resistance, even if the first adhesive layer 30 is exposed to a high temperature, melting or decomposition can be avoided. Therefore, the electrostatic chucking device 1 having the first adhesive layer 30 can be operated even under a high temperature environment.

Here, in order to maintain the adhesion between the first ceramic plate 10 and the second ceramic plate 40, the first adhesive layer 30 is required to be able to relax thermal stress generated due to a temperature change.

The thermal stress is caused due to the difference between the thermal expansion coefficients of the first ceramic plate 10 and the second ceramic plate 40. However, since each of the first ceramic plate 10 and the second ceramic plate 40 is made of ceramic, there is no such significant difference between the thermal expansion coefficients thereof. Therefore, even if a material having low flexibility is used for the first adhesive layer 30, sufficiently high adhesive properties can be maintained, and the problem such as positional misalignment and the like is not caused.

As the material having such a heat resistance and configuring the first adhesive layer which can relax stress generated between the first ceramic plate 10 and the second ceramic plate 40, for example, a polyimide resin or the like can be employed.

The thickness of the first adhesive layer 30 is preferably 50 μm or more and 500 μm or less and is more preferably 100 μm or more and 300 μm or less. Here, the thickness of the first adhesive layer 30 corresponds to the gap between the first ceramic plate 10 and the second ceramic plate 40.

When the thickness of the first adhesive layer 30 is excessively thin, heat generated in the heating member 20 is immediately transferred to the second ceramic plate 40, and it becomes difficult to sufficiently lower the temperature throughout the cooling base portion 60. Meanwhile, when the thickness of the first adhesive layer 30 is excessively thick, in a case where the first adhesive layer 30 has low flexibility, a hard and thick layer is formed on the adhesive interface. Therefore, distortion caused due to stress cannot be sufficiently relaxed, and there is a high possibility of causing problems such as positional misalignment, peeling, and the like.

In addition, when the thickness of the first adhesive layer 30 becomes thick, heat transfer properties with respect to the cooling base portion 60 is degraded, and deterioration of cooling characteristics occurs.

It is preferable that the heat transfer coefficient of the first adhesive layer 30 is not excessively high, and specifically is preferably ½ or less of the heat transfer coefficient of the second ceramic plate. When the heat transfer coefficient of the first adhesive layer 30 is low, heat transfer of the electrostatic chucking device in the vertical direction (the negative-Z direction) is reduced. Therefore, the temperature can be sufficiently lowered throughout the cooling base portion 60. That is, the temperature of the second adhesive layer 50 described below can be restrained from being excessively high.

It is preferable that the specific value of the thermal conduction coefficient of the first adhesive layer 30 ranges from 0.10 W/mK to 0.50 W/mK.

A spacer 31 may be installed between the first ceramic plate 10, and the heating member 20 and the second ceramic plate 40, and the gap between the first ceramic plate 10, and the heating member 20 and the second ceramic plate 40 may be adjusted. In FIG. 1, the spacer 31 is interposed between the heating member 20 and the second ceramic plate 40 and may be interposed between the first ceramic plate 10 and the second ceramic plate 40.

The spacer 31 is not particularly limited. However, from the viewpoint of restraining an occurrence of stress accompanied by the difference of the thermal expansion coefficient with respect to the first adhesive layer 30 and an occurrence of a local temperature fluctuation caused due to the difference of the thermal conduction coefficient, it is preferable to use polyimide or the like of which the thermal expansion coefficient and the thermal conduction coefficient are approximated to those of the first adhesive layer 30 and which has a high modulus of rigidity even at a high temperature.

<Second Ceramic Plate>

The second ceramic plate 40 is adhered to the first ceramic plate 10 and the heating member 20 via the first adhesive layer 30.

It is preferable that the second ceramic plate 40 is made of an insulative ceramic sintered body which has mechanical strength and durability with respect to corrosive gas and plasma thereof, such as a composite sintered body of aluminum oxide-silicon carbide ($Al_2O_3$—SiC), a sintered body of aluminum oxide ($Al_2O_3$), a sintered body of aluminum nitride (AlN), a sintered body of yttrium oxide ($Y_2O_3$), and the like.

For the second ceramic plate 40, it is preferable to use a material having a small difference of the thermal expansion coefficient with respect to the first ceramic plate 10, among the materials disclosed above. Specifically, the difference of the thermal expansion coefficient is preferably $4\times10^{-6}$/K or less, and the difference of the thermal expansion coefficient is more preferably $2\times10^{-6}$/K or less. As a combination for the first ceramic plate 10 and the second ceramic plate 40, for example, it is preferable that a composite sintered body of aluminum oxide-silicon carbide ($Al_2O_3$—SiC) is used for the first ceramic plate 10 and a sintered body of aluminum oxide ($Al_2O_3$) is used for the second ceramic plate 40. According to such a configuration, as described above, even in a case where the first adhesive layer 30 has low flexibility, stress accompanied by the difference of the thermal expansion coefficient can be sufficiently relaxed.

It is preferable that the second ceramic plate 40 has a high thermal conduction coefficient from the viewpoint of enhancing the temperature uniformity of the electrostatic chucking device 1 in an in-plane direction. Meanwhile, in order to sufficiently lower the temperature throughout the cooling base portion 60, from the viewpoint of restraining the thermal conduction of the electrostatic chucking device 1 in the vertical direction (the negative-Z direction), it is preferable to have a low thermal conduction coefficient. Therefore, the thermal conduction coefficient of the second ceramic plate 40 preferably ranges from 1.0 W/mK to 200 W/mK, more preferably ranges from 10 W/mK to 150 W/mK, and further more preferably ranges from 30 W/mK to 50 W/mK. In addition, from the viewpoint of maintaining heat transfer in the in-plane direction and restraining heat transfer in the vertical direction, a ceramic plate having a high thermal conduction coefficient and a plate in which sheets such as polyimide and the like having a low thermal conduction coefficient are stacked may be adopted.

The thickness of the second ceramic plate 40 is preferably 0.4 mm or more and 3.0 mm or less. When the thickness of the second ceramic plate 40 falls below 0.4 mm, it becomes difficult to ensure mechanical strength of the second ceramic plate 40. In addition, it becomes difficult to sufficiently lower the temperature throughout the cooling base portion 60. Meanwhile, when the thickness of the second ceramic plate 40 exceeds 3.0 mm, the thermal capacity of the second ceramic plate 40 excessively increases, and the thermal responsiveness of a placed plate-shaped sample W deteriorates. Moreover, due to the increase of the thermal conduction of the second ceramic plate 40 in the in-plane direction, in a case of dividing the heating member and independently controlling each thereof, it is difficult to maintain the in-plane temperature of the plate-shaped sample W at a desired temperature pattern.

<Second Adhesive Layer>

The second adhesive layer 50 is interposed between the second ceramic plate 40 and the cooling base portion 60. The second adhesive layer 50 causes the second ceramic plate 40 and the cooling base portion 60 to be adhered and integrated together. In addition, the second adhesive layer 50 relaxes thermal stress of the interface between the first ceramic plate 10, and the heating member 20 and the second ceramic plate 40 caused due to the difference between the thermal expansion coefficients of the first ceramic plate 10, and the heating member 20 and the second ceramic plate 40.

In order to relax thermal stress generated between the second ceramic plate 40 and the cooling base portion 60, the Young's modulus of the second adhesive layer 50 is required to be smaller than the Young's modulus of the first adhesive layer 30. Generally, the cooling base portion 60 is made of metal (will be described later), and the difference of the thermal expansion coefficient with respect to the second ceramic plate 40 is significant. Therefore, the second adhesive layer 50 is flexible only as much as distortion corresponding to the difference of the thermal expansion coefficient can be relaxed. Therefore, the second adhesive layer 50 is required to have a smaller Young's modulus than the first adhesive layer 30 causing the interfaces of the first ceramic plate 10 and the second ceramic plate 40 of which the difference between the thermal expansion coefficients is comparatively small to be adhered.

Specifically, the Young's modulus of the second adhesive layer 50 is preferably 10 MPa or less, is more preferably 8 MPa or less, and is furthermore preferably 5 MPa or less. When the Young's modulus of the second adhesive layer 50 is within the range or less, the difference between the thermal expansion coefficients of the second ceramic plate 40 and the cooling base portion 60 can be absorbed, and an occurrence of a problem such as positional misalignment, peeling, and the like can be restrained.

In addition, the heat resistance of the second adhesive layer 50 is preferably 100° C. or more and is more preferably 150° C. or more. In the stage where heat generated in the heating member 20 is transferred to the second adhesive layer 50, the temperature generated by the heat is sufficiently lowered. Therefore, it is sufficient for the second adhesive layer to have a heat resistance for the temperature or more thereof.

As the material configuring such as second adhesive layer 50, for example, a silicone-based resin, an acrylic resin, or the like can be used.

The heat transfer coefficient of the second adhesive layer 50 is preferably ½ or less of the heat transfer coefficient of the second ceramic plate. According to the configuration, heat transfer properties in the in-plane direction parallel to the placement surface of the electrostatic chucking device and in the vertical direction can have anisotropy. As described above, the second ceramic plate 40 can enhance the temperature uniformity in the in-plane direction. Meanwhile, when the above-described heat transfer coefficients of the first adhesive layer 30 and the second adhesive layer 50 are ½ or less of the heat transfer coefficient of the second ceramic plate, the heat transfer properties in the vertical direction can be lowered, compared to the heat transfer properties in the in-plane direction.

<Cooling Base Portion>

The cooling base portion 60 is adhered via the second ceramic plate 40 and the second adhesive layer 50 and cools at least the second ceramic plate 40. By cooling the second ceramic plate 40, the first ceramic plate 10 and the plate-shaped sample W adhered to the second ceramic plate 40 can be adjusted to a desired temperature.

As the cooling base portion 60, for example, it is preferable to adopt a liquid cooling base or the like in which a flow channel (illustration omitted) causing a refrigerant to flow is internally formed.

The material configuring the cooling base portion 60 is not particularly limited as long as the material is metal which is excellent in thermal conductivity, conductivity, and processability or a compound material containing the metal. For example, aluminum (Al), an aluminum alloy, copper (Cu), a copper alloy, stainless steel (SUS), and the like are preferably used. It is preferable that at least a surface of the cooling base portion 60 exposed to plasm is subjected to alumite treatment or film formation with an insulative film such as alumina and the like.

The cooling base portion 60 is provided with a penetration hole for inserting the second extraction electrode 15E and the power supply terminal 22. In addition to thereof, the cooling base portion 60 may be provided with a plurality of penetration holes such as a penetration hole for inserting a lift pin which pushes up a wafer in the processing step of the plate-shaped sample W, a penetration hole for supplying cooling gas to a space between the plate-shaped sample W and the placement plate 11, and the like, in accordance with the purpose.

According to the configuration of the electrostatic chucking device 1 in First Example, even at a high temperature of 200° C. or more, the first adhesive layer 30 can be restrained from deteriorating. That is, in-plane uniformity of temperature can be enhanced. In addition, since each of the first ceramic plate 10 and the second ceramic plate 40 is made of ceramic, there is no significant difference between the thermal expansion coefficients thereof. Therefore, even if the first ceramic plate 10 and the second ceramic plate 40 are adhered together via the first adhesive layer 30, those do not peel off from each other.

In addition, since the second adhesive layer 50 can be configured to be far from the heating member 20 and close to the cooling base portion 60, the second adhesive layer 50 can be restrained from deteriorating. In addition, since the Young's modulus of the second adhesive layer 50 is smaller than the Young's modulus of the first adhesive layer 30, even if the difference between the thermal expansion coefficients of the second ceramic plate 40 and the cooling base portion 60 is significant, stress can be sufficiently relaxed.

Therefore, by using the configuration described above, it is possible to provide the electrostatic chucking device 1 which can be used even at a high temperature of 200° C. or more and has a high heat resistance.

(Second Embodiment)

Figure 2:
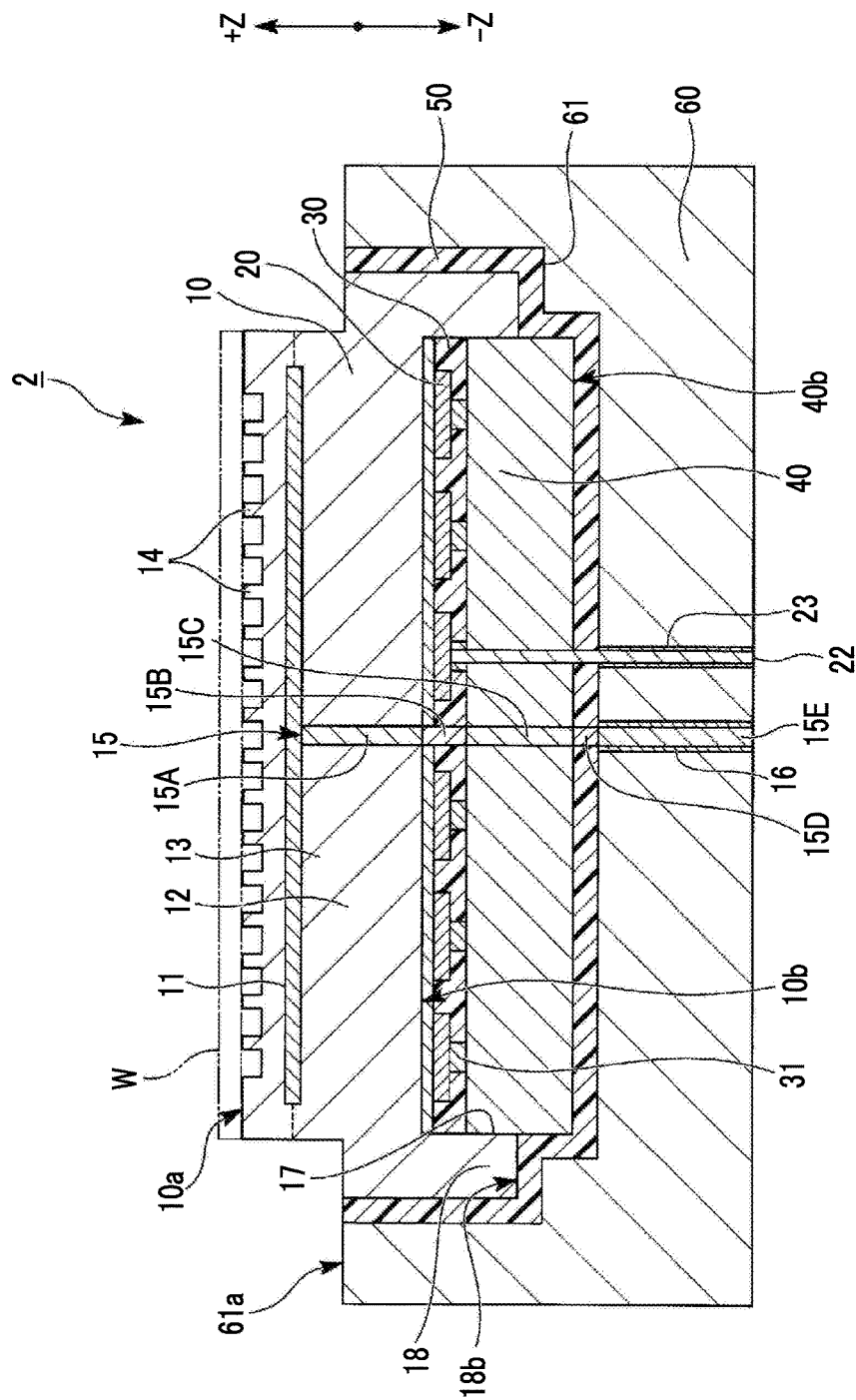
FIG. 2 is a cross-sectional view schematically illustrating an electrostatic chucking device of a second embodiment.

FIG. 2 is a cross-sectional view schematically illustrating an electrostatic chucking device 2 of a second embodiment. In the electrostatic chucking device 2 of the second embodiment, the cooling base portion 60 has a first recess portion 61. At least the first adhesive layer 30 and the second ceramic plate 40 are fitted in the first recess portion 61. In addition, the first ceramic plate 10 has a bank portion 18 surrounding the periphery of the second surface 10b. Moreover, via the first adhesive layer 30, the second ceramic plate 40 is fitted in a second recess portion 17 formed by the bank portion 18 and the second surface 10b.

That is, the second recess portion 17 is formed on the second surface 10b of the first ceramic plate 10. Moreover, in the second recess portion 17, a member in which the second ceramic plate 40 is fitted and integrated is formed via the heating member 20 and the first adhesive layer 30. Then, the integrated member is fitted in the first recess portion 61 of the cooling base portion 60. Therefore, the electrostatic chucking device 2 of the second embodiment is different from the electrostatic chucking device 1 of the first embodiment in that the first recess portion 61 and the second recess portion 17 are provided.

As described above, FIG. 2 illustrates the electrostatic chucking device fitted in a twofold state. However, a structure in which only one therebetween is fitted may be adopted. Therefore, a case of only a structure in which the cooling base portion 60 has the first recess portion 61, and the second ceramic plate 40 and the first adhesive layer 30 are fitted may be adopted. In addition, a case of only a structure in which the first ceramic plate 10 has the second recess portion 17, and the second ceramic plate 40 is fitted in the second recess portion 17 via the first adhesive layer 30 may be adopted.

According to the configuration, even if thermal stress is applied in accordance with the difference between the thermal expansion coefficients of the first ceramic plate 10 and the second ceramic plate 40, and the cooling base portion 60, an occurrence of positional misalignment and the like can be restrained due to the fitted state. In addition, most portions of the first adhesive layer 30 and the second adhesive layer 50 are not exposed to a surface irradiated with plasma in the steps of etching and the like, and consumption caused due to corrosive deterioration and the like can be restrained.

In addition, in FIG. 2, the second ceramic plate 40 is fitted in the second recess portion 17 of the first ceramic plate 10, and a portion of the second ceramic plate 40 protrudes from the bank portion 18 of the first ceramic plate 10. In the electrostatic chucking device 2 of the second embodiment, the portion does not necessarily protrude. In the configuration, the second ceramic plate 40 may be completely fitted in the first ceramic plate 10, and a surface 18b of the bank portion 18 of the first ceramic plate 10 on the cooling base side and a rear surface 40b of the second ceramic plate 40 on the cooling base portion 60 side may be the same plane. In addition, the rear surface 40b of the second ceramic plate 40 on the cooling base portion 60 side may be configured to be recessed with respect to the surface 18b of the bank portion 18 of the first ceramic plate 10 on the cooling base side.

In regard to the depth of the first recess portion 61 of the cooling base portion 60, it is preferable that the placement surface of the first ceramic plate 10 for the plate-shaped sample W is positioned so as not to be lower than a surface 61a of the cooling base portion 60 irradiated with plasma. That is, it is preferable not to have a structure in which the electrostatic chucking device 2 is completely embedded in the cooling base portion.

It is preferable that the depth of the second recess portion 17 of the first ceramic plate 10 is half or less of the thickness of the supporting plate 12. When the depth of the second recess portion 17 of the first ceramic plate 10 is excessively deep, it becomes difficult to retain the strength of the supporting plate 12. Meanwhile, when the depth of the supporting plate 12 is excessively shallow, there are cases of being exposed to an environment in which a portion of the first adhesive layer 30 is irradiated with plasma, thereby being not preferable.

In addition, the thickness of the first ceramic plate 10 in this case is preferably 3.0 mm or more and 7.0 mm or less. Here, the thickness of the first ceramic plate 10 denotes a thickness of a portion having the maximum thickness from one surface of the first ceramic plate 10 to the other surface. When the thickness of the first ceramic plate 10 is 3.0 mm or more, even if the second recess portion 17 is formed, sufficient strength can be maintained. Meanwhile, when the thickness of the first ceramic plate 10 is 7.0 mm or less, the thermal capacity of the first ceramic plate 10 excessively increases, and thermal responsiveness of a placed plate-shaped sample W deteriorates.

Moreover, in a case where the first ceramic plate 10 has the second recess portion 17, it is preferable that the thermal expansion coefficient of the second ceramic plate 40 to be fitted is the thermal expansion coefficient of the first ceramic plate 10 or less. When the thermal expansion coefficient of the second ceramic plate 40 is the thermal expansion coefficient of the first ceramic plate 10 or more, there is a possibility that the first ceramic plate 10 is damaged. This is cased due to the second ceramic plate 40 which expands and becomes the size of the fitted second recess portion 17 of the first ceramic plate 10 or more.

Here, since the first ceramic plate 10 is adjacent to the heating member 20 and is irradiated with plasma, the temperature of the second ceramic plate 40 does not become higher than the first ceramic plate 10. Accordingly, even if the thermal expansion coefficients of the first ceramic plate 10 and the second ceramic plate 40 are the same as each other, the first ceramic plate 10 has the greater expansion coefficient. Therefore, the thermal expansion coefficients of the first ceramic plate 10 and the second ceramic plate 40 may be the same as each other.

In regard to the second adhesive layer 50, the cooling base portion 60 is provided along the first recess portion 61, and the cooling base portion is coated up to the uppermost surface. When the fitting portion with respect to the first recess portion 61 is coated with the second adhesive layer, the first adhesive layer 30 can be restrained from being exposed to the peripheral environment. That is, the first adhesive layer 30 can be restrained from deteriorating. In addition, the second ceramic plate 40 and the first adhesive agent 30 can be firmly fitted in the first recess portion 61 of the cooling base portion 60.

According to the configuration of the electrostatic chucking device 2 of the second embodiment, even if there is a difference between the thermal expansion coefficients of the first ceramic plate and the second ceramic plate, and the cooling base portion, an occurrence of positional misalignment and the like can be restrained due to the fitted state. In addition, in steps of etching and the like, the first adhesive layer and the second adhesive layer can be restrained from being exposed to a surface irradiated with plasma, and the first adhesive layer and the second adhesive layer can be restrained from being consumed due to deterioration or the like.

(Third Embodiment)

Figure 3:
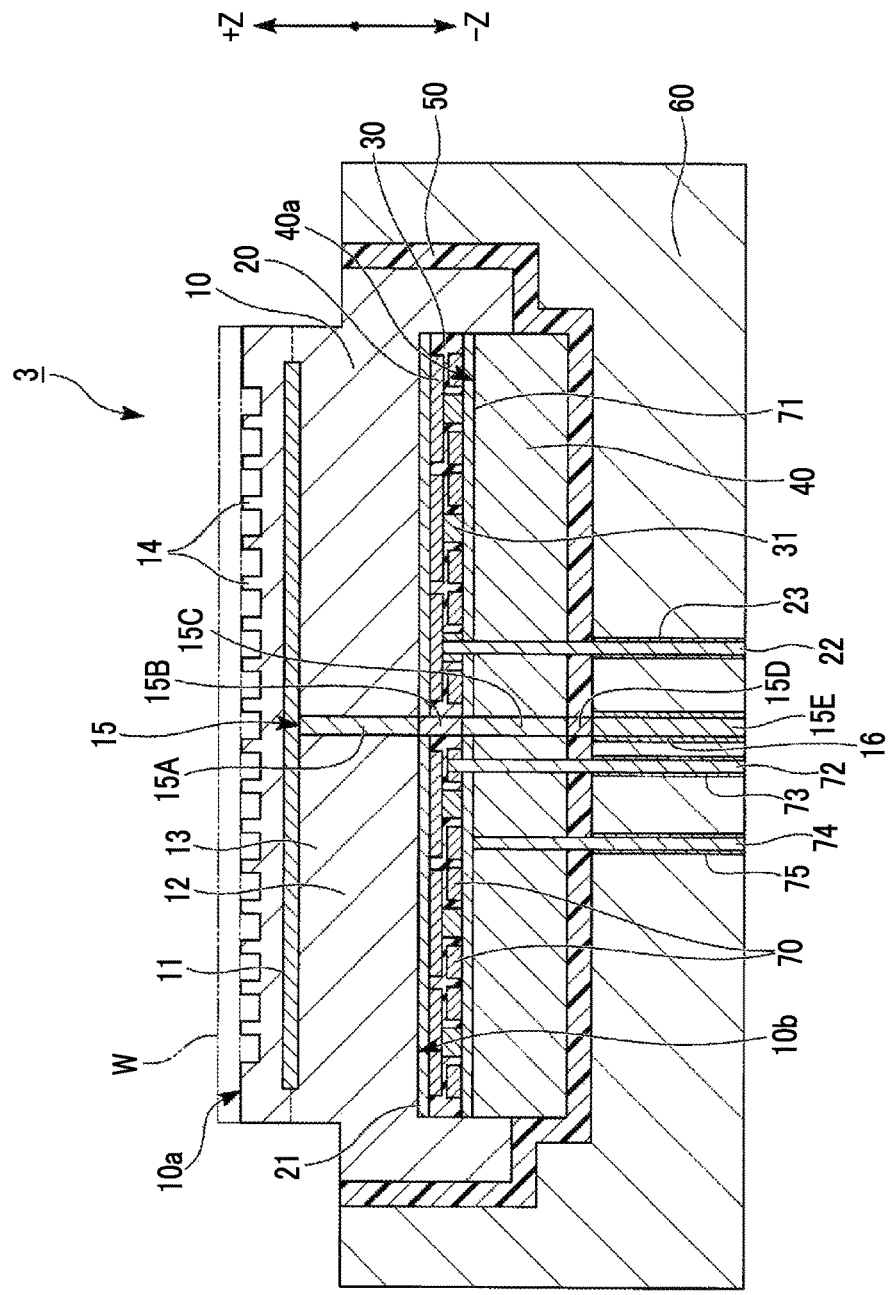
FIG. 3 is a cross-sectional view schematically illustrating an electrostatic chucking device of a third embodiment.

FIG. 3 is a cross-sectional view schematically illustrating an electrostatic chucking device 3 of a third embodiment. The electrostatic chucking device 3 of the third embodiment is different from the electrostatic chucking device 1 of the first embodiment in that a plurality of auxiliary heating members 70 are fixed to one surface 40a of the second ceramic plate 40 on the first ceramic plate 10 side.

The auxiliary heating members 70 are fixed to the one surface 40a of the second ceramic plate 40 on the first ceramic plate 10 side via an adhesive layer 71. Similar to the heating member 20, each of the auxiliary heating members 70 is a belt-shaped member in which a belt-shaped metal material having a narrow width meanders. The auxiliary heating members 70 are members for compensating ununiformity of heat generated in the heating member 20 and includes the plurality of members.

Figure 4:
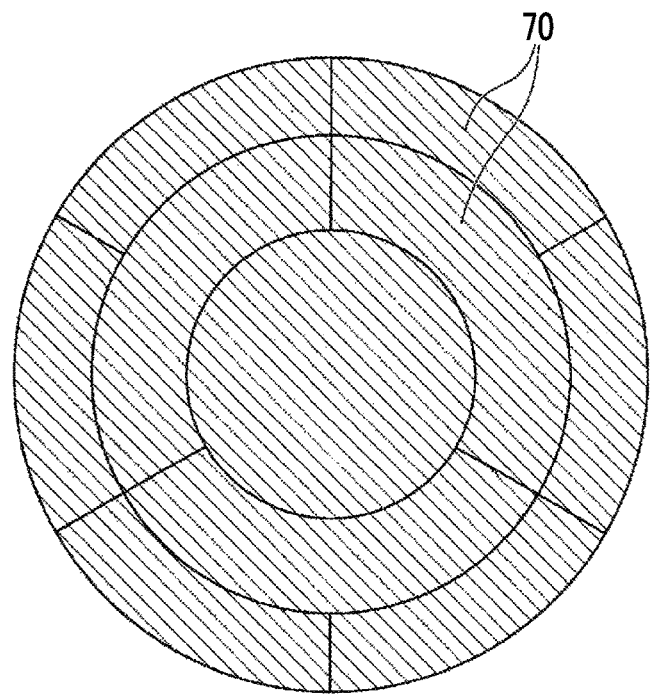
FIG. 4 schematically illustrates a region in which auxiliary heating members can be individually disposed and schematically illustrates a case where a placement surface of the electrostatic chucking device is divided into ten.

The plurality of auxiliary heating members 70 can be disposed for each of regions which are divided into ten regions as in FIG. 4, for example, in a planar view from the placement surface side of the plate-shaped sample W. Particularly, in a case where the heating member 20 is divided in a concentric circular shape, it is preferable to configure the concentric circular-shaped region to be divided into several regions in the radial direction as illustrated in FIG. 4. In addition, in FIG. 4, the auxiliary heating members 70 are respectively disposed in regions by dividing the placement surface into ten regions. However, without being limited to the configuration, the auxiliary heating members 70 may be divided into a plurality of more members or may be divided into a plurality of less members. Each of the plurality of auxiliary heating members 70 can be independently controlled. In addition, the auxiliary heating members 70 may be configured in multiple layers insulated from each other. In addition, for each layer, the region may be differently divided. In a case where the auxiliary heating members 70 are configured in multiple layers and the region is differently divided in each layer, the boundary portions for each region which cannot be subjected to auxiliary heating in a case of one layer can be compensated each other.

Since the electrostatic chucking device 3 has the auxiliary heating members 70, the in-plane uniformity of temperature of the plate-shaped sample W placed in the electrostatic chucking device 3 can be enhanced.

Each of the plurality of auxiliary heating members 70 can be independently controlled. It is preferable that the amount of power supply per unit area supplied to each of the plurality of auxiliary heating members 70 is $\frac{1}{5}$ or less of the amount of power supply per unit area of the heating member 20.

When power is supplied to the auxiliary heating members 70, cooling by the cooling base portion 60 for the region to which power is supplied can be limited. As the result thereof, the temperature of the regions of the auxiliary heating members 70 to which power is supplied is unlikely to be lowered, and the in-plane temperature uniformity can be controlled. That is, the auxiliary heating member 70 can function when power to the extent that the temperature change can be controlled is supplied and does not require the amount of power supply as much as the heating member 20. Therefore, the auxiliary heating member 70 does not become high in temperature as much as the heating member 20.

The adhesive layer 71 approaches the heating member 20 and comes into contact with the auxiliary heating members 70, thereby having the heat resistance for a high temperature of 200° C. or more. As the adhesive layer 71, for example, a polyimide sheet can be used. The adhesive layer 71 may be formed on the entire surface of one surface of the second ceramic plate 40 and may be formed on only the places where the auxiliary heating members 70 are formed.

In a case where a polyimide sheet is used as the adhesive layer 71, the adhesive layer 71 can also serve as an insulative layer configuring the auxiliary heating members 70. This will be described below.

Figure 5:
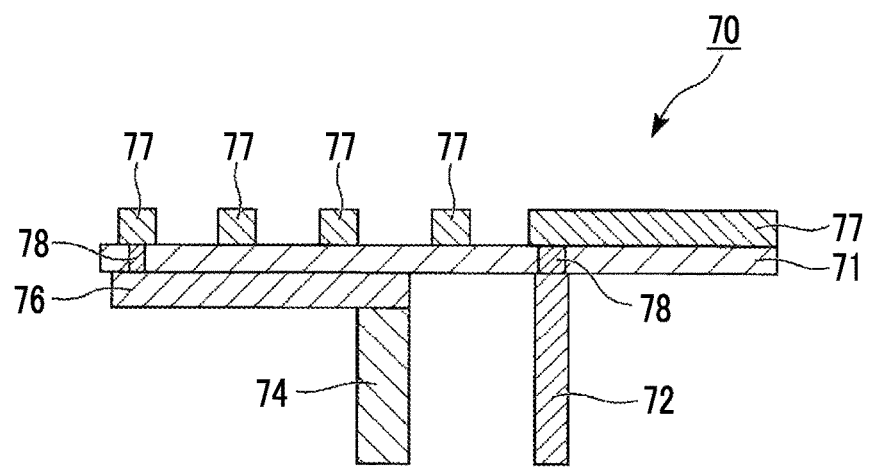
FIG. 5 illustrates a schematic cross-sectional view of the auxiliary heating member.

FIG. 5 is a schematic cross-sectional view of the auxiliary heating member 70. The auxiliary heating member 70 has an energization wiring 76 and a heat generation wiring 77 interposing the insulative layer (the adhesive layer 71) therebetween. FIG. 5 is a schematic cross-sectional view and is illustrated such that the heat generation wiring 77 is divided. However, the heat generation wiring 77 made of a meandering belt-shaped metal material and is integrated in a planar view. The energization wiring 76 and the heat generation wiring 77 are electrically connected to each other via connection portion 78. Therefore, power supplied from an energization terminal 74 flows through the energization wiring 76 and is supplied to the heat generation wiring 77 via the connection portion 78. The heat generation wiring 77 generates heat when power flows. A lead terminal 72 is connected to the heat generation wiring 77 via the connection portion 78, and the auxiliary heating members 70 configure one circuit. In this case, since the insulative layer is required to be highly insulative, a polyimide sheet is often used. In this case, the adhesive layer 71 can also serve as an insulative layer configuring the auxiliary heating member 70. As the energization wiring 76 of the auxiliary heating member 70, metal such as copper and the like having high electrical conductivity can be used. As the heat generation wiring 77, metal similar to the heating member 20 can be used. Among thereof, it is preferable to use Ti. In order to maintain insulative properties with respect to the cooling base portion 60, the peripheries of the energization terminal 74 and the lead terminal 72 may be coated with insulators 73 and 75.

According to the configuration of the electrostatic chucking device 3 of the third embodiment, uneven heating generated in the heating member can be compensated by the auxiliary heating member. That is, the temperature uniformity of the electrostatic chucking device can be enhanced.

(Fourth Embodiment)

Figure 6:
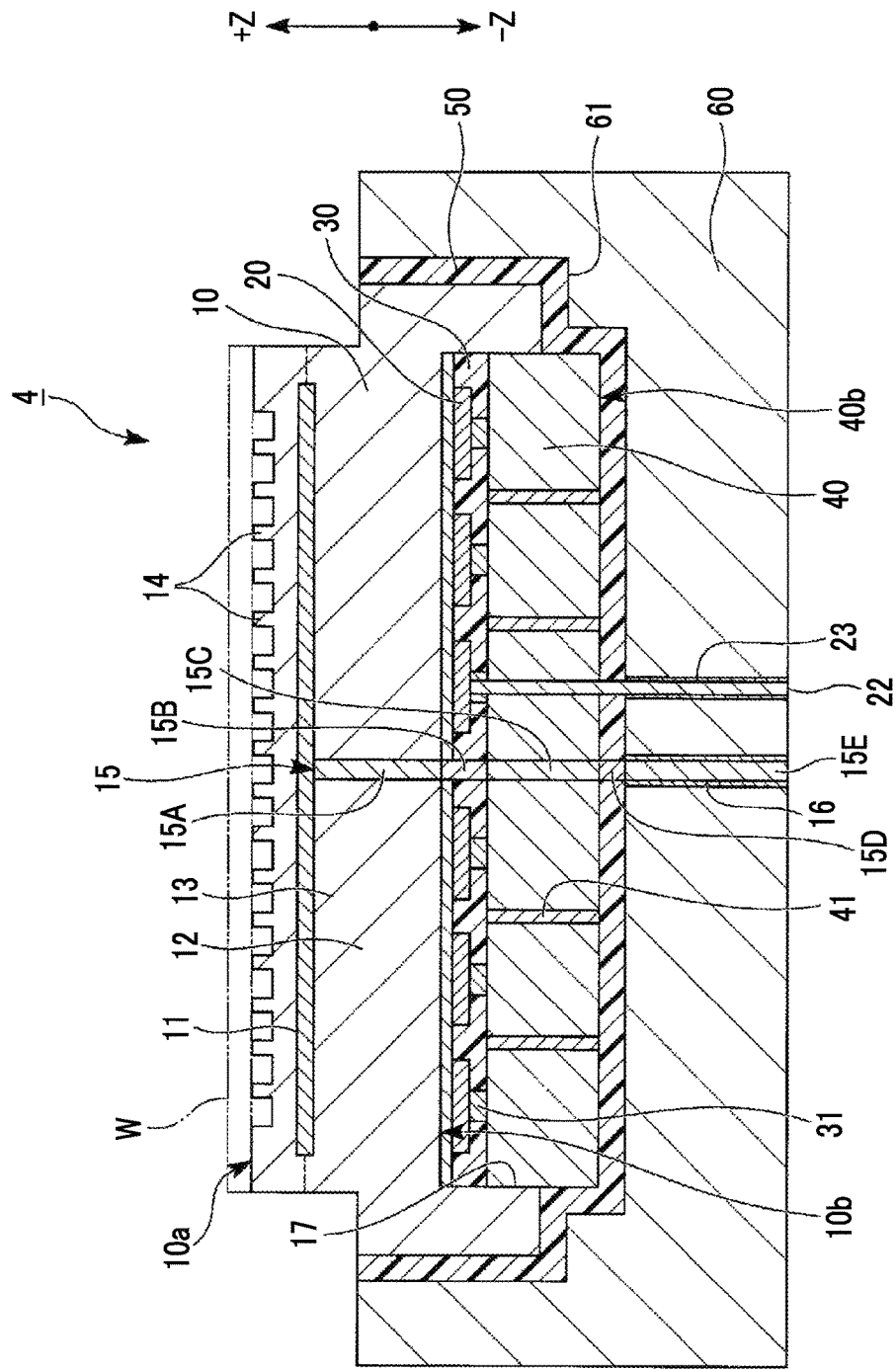
FIG. 6 is a cross-sectional view schematically illustrating an electrostatic chucking device of a fourth embodiment.

FIG. 6 is a cross-sectional view schematically illustrating an electrostatic chucking device 4 of a fourth embodiment. In the electrostatic chucking device 4 of the fourth embodiment, as disclosed as a preferable example of the electrostatic chucking device 1 of the first embodiment, the heating member 20 is formed of a plurality of separated members and each thereof can be individually controlled. In addition, the point in which the second ceramic plate 40 is divided heat-conductively in accordance with the region in which the temperatures of the separated heating members 20 can be individually controlled is also different from the electrostatic chucking device 1 of the first embodiment.

Here, being divided heat-conductively indicates a state in which the heat transfer between the regions which can be controlled is lower than the heat transfer within the region (a groove or a substance having a lower thermal conduction coefficient than the ceramic plate is interposed between the regions) and is not necessarily limited to a case where the ceramic plate is divided.

For example, when the second ceramic plate 40 is divided by a heat insulating layer 41, the thermal conduction in the in-plane direction can be controlled, and the temperature controllability for each region which is independently controlled can be enhanced. Particularly, in the in-plane direction of the electrostatic chucking device, thermal conduction in a concentric circle direction (the circumferential direction) is allowed. However, thermal conduction in a radial direction can cause hindrance to the temperature uniformity. Therefore, it is preferable that the region is divided into concentric circular shapes.

For example, as the heat insulating layer 41, the same material configuring the first adhesive layer 30 can be used. As described above, in the first adhesive layer 30, in order not to cause the temperature of the second adhesive layer 50 to be excessively high, it is preferable that the thermal conduction of the electrostatic chucking device in the vertical direction is not excessively high. Therefore, as the heat insulating layer 41, the material configuring the first adhesive layer 30 can be used. In addition, since the heat insulating layer 41 is disposed at a position closer to the heating member 20 compared to the second adhesive layer 50, the heat resistance is required. Since the first adhesive layer 30 has a high heat resistance, as the heat insulating layer 41, the material configuring the first adhesive layer 30 can be used.

According to the configuration of the electrostatic chucking device 4 of the fourth embodiment, the temperature of the separated heating members can be controlled for each region, and the temperature uniformity of the electrostatic chucking device can be enhanced. In addition, when the second ceramic plate is divided heat-conductively in accordance with the region, heat transfer in the in-plane direction via the second ceramic plate is restrained, and the temperature controllability for each region can be further enhanced.

(Fifth Embodiment)

Figure 7:
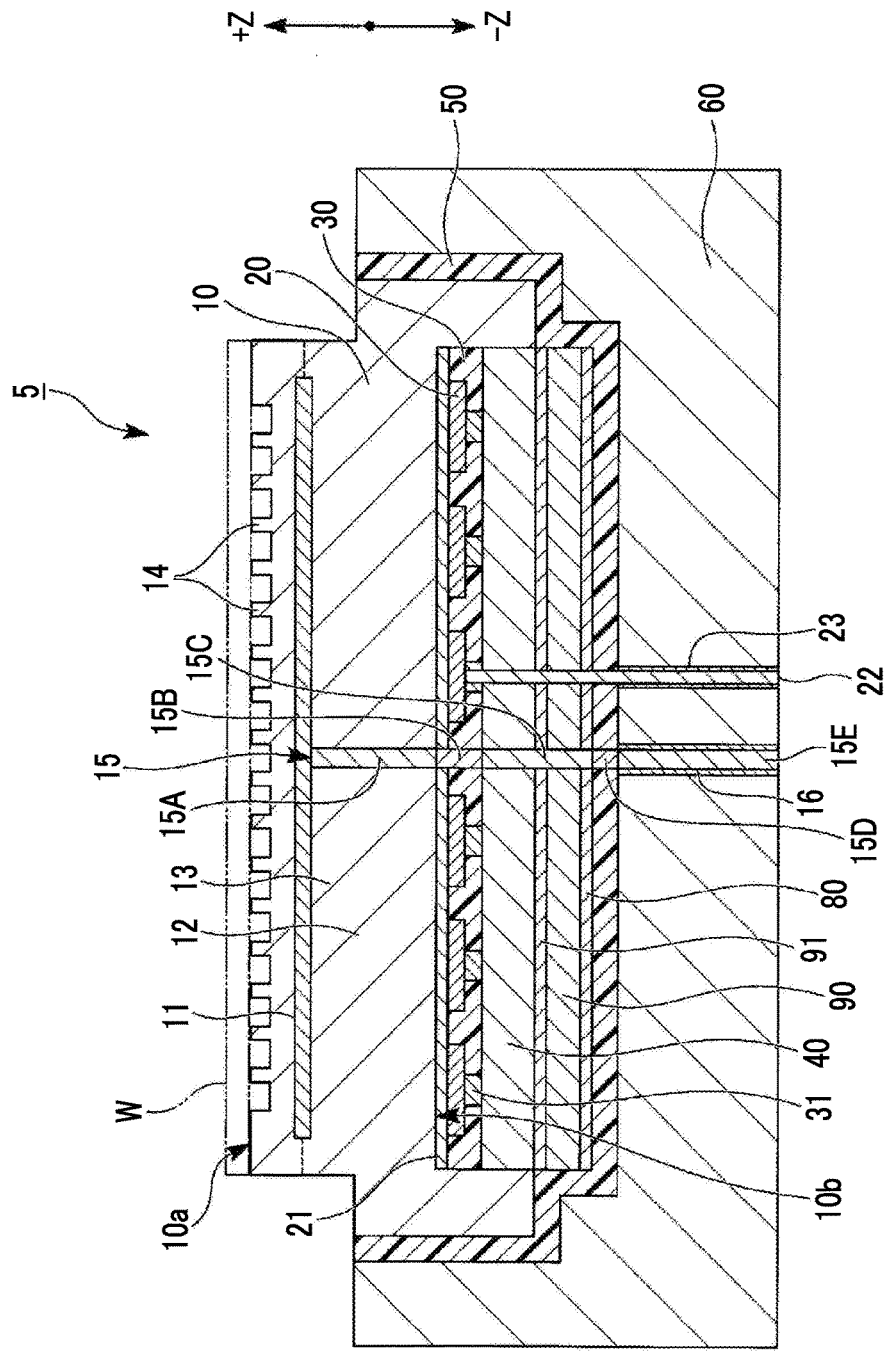
FIG. 7 is a cross-sectional view schematically illustrating an electrostatic chucking device of a fifth embodiment.

FIG. 7 is a cross-sectional view schematically illustrating an electrostatic chucking device 5 of a fifth embodiment. The electrostatic chucking device 5 of the fifth embodiment is different from the electrostatic chucking device 1 of the first embodiment in that a third adhesive layer 80 having a higher heat resistance than the second adhesive layer 50 is interposed between the second ceramic plate 40 and the second adhesive layer 50, and one or more ceramic plates 90 are interposed between the second ceramic plate 40 and the second adhesive layer 50.

FIG. 7 illustrates the structure in which the third adhesive layer 80 and the ceramic plate 90 interposed together between the second ceramic plate 40 and the second adhesive layer 50. However, only one thereof may be configured to be interposed.

According to the configuration, heat transfer of the electrostatic chucking device 5 in the vertical direction (the negative-Z direction) is restrained and a high temperature of the second adhesive layer 50 can be avoided. If the temperature of the second adhesive layer 50 does not become high, the second adhesive layer 50 can maintain adhesive properties, and positional misalignment and the like can be restrained from occurring.

The third adhesive layer 80 is considered to be high in temperature due to the disposition at a position closer to the heating member 20 than the second adhesive layer 50. Therefore, it is preferable that the heat resistance is higher than the second adhesive layer 50. The third adhesive layer 80 is acceptable as long as the condition is satisfied. For example, a polyimide resin or the like can be used.

One or more, that is, a plurality of ceramic plates 90 may be interposed therebetween. It is preferable that the ceramic plate 90 is made of a material having poor heat transfer properties. For example, mullite (aluminum silicate mineral) or the like can be used. Due to the poor heat transfer coefficient of the ceramic plate 90, the second adhesive layer 50 can be restrained from being high in temperature.

In a case where the plurality of ceramic plates 90 are interposed, it is preferable to be joined together via an adhesive layer 91 or the like having a higher heat resistance than the second adhesive layer 50.

In addition, similar to the second ceramic plate 40 of the fourth embodiment, the ceramic plate 90 may have a structure of being divided for each region. In order to enhance the temperature controllability of the region heated by the auxiliary heating member 70, it is preferable to be separated in accordance with the separated shape of the second ceramic plate 40 of the fourth embodiment.

<Method of Manufacturing Electrostatic Chucking Device>

Subsequently, a method of manufacturing the electrostatic chucking device 1 will be described. In regard to the method of manufacturing the electrostatic chucking device 1 of the first embodiment to the electrostatic chucking device 5 of the fifth embodiment, the manufacturing method will be described based on the electrostatic chucking device of the first embodiment, and only the different points of the electrostatic chucking devices of other Examples will be mentioned.

First, the plate-shaped placement plate 11 and supporting plate 12 are prepared by using a composite sintered body of aluminum oxide-silicon carbide ($Al_2O_3$—SiC) or a sintered body of yttrium oxide ($Y_2O_3$). In this case, mixed powder containing silicon carbide powder and aluminum oxide powder, or yttrium oxide powder are formed in a desired shape. Thereafter, for example, calcination is performed at a temperature ranging from 1,400° C. to 2,000° C. under a non-oxidative atmosphere, preferably under an inert atmosphere for a predetermined time, and the placement plate 11 and the supporting plate 12 can be obtained.

On or a plurality of holes for fitting and retaining the lead electrode 15A of the internal electrode terminal 15 are formed in the supporting plate 12. The lead electrode 15A is prepared so as to have a size and a shape being able to be in tight contact with and fixed to the fixing hole of the supporting plate 12. As a preparation method of the lead electrode 15A, for example, in a case where the lead electrode 15A is made of the conductive composite sintered body, a method in which conductive ceramic powder is formed in a desired shape and is subjected to pressurization calcination, and the like can be exemplified.

As the conductive ceramic powder used for the lead electrode 15A, it is preferable to use conductive ceramic powder made of the same material as the internal electrode 13 for electrostatic adsorption.

In a case where the lead electrode 15A is made of metal, high-melting metal is used, a forming method and the like performed through metal processing method and the like such as a grinding method, powder metallurgy, and the like can be exemplified.

A predetermined region on the surface of the supporting plate 12 in which the lead electrode 15A is fitted is coated with coating liquid for forming an internal electrode for electrostatic adsorption in which a conductive material such as the conductive ceramic powder and the like is dispersed in an organic solvent so as to be in contact with the lead electrode 15A and is dried, thereby making the internal electrode 13 for electrostatic adsorption.

As the coating method, since the coating is required to be performed at a uniform thickness, it is desirable to use the screen printing method or the like. In addition, as alternative methods, there are a method of forming a thin film of high-melting metal through the vapor deposition method or the sputtering method, a method in which the thin plates made of the conductive ceramic or the high-melting metal are arranged to serve as the internal electrode 13 for electrostatic adsorption, and the like.

In addition, in order to improve insulative properties, corrosion resistant properties, and plasma resistant properties in the region on the supporting plate 12 other than the region in which the internal electrode 13 for electrostatic adsorption is formed, an insulative material layer containing a powder material having the same composition or the main component as the placement plate 11 and the supporting plate 12 is formed. For example, the insulative material layer can be formed by coating a predetermined region with coating liquid in which insulative material powder having the same composition or the same main component as the placement plate 11 and the supporting plate 12 is dispersed in an organic solvent, through screen printing or the like, and by performing drying.

Subsequently, the placement plate 11 is superimposed on the internal electrode 13 for electrostatic adsorption on the supporting plate 12, and the insulative material layer, and these are integrated by performing hot calendering at a high temperature under high pressure. It is preferable that the atmosphere in the hot calendering is vacuum or an inert atmosphere such as Ar, He, $N_2$, and the like.

In addition, the pressure during uniaxial pressing in the hot calendering preferably ranges from 5 MPa to 10 MPa and the temperature preferably ranges from 1,400° C. to 1,850° C.

According to the hot calendering, the internal electrode 13 for electrostatic adsorption is calcinated and becomes the internal electrode 13 for electrostatic adsorption made of the conductive composite sintered body. At the same time, the supporting plate 12 and the placement plate 11 are joined and integrated together.

In addition, the internal electrode 13 for electrostatic adsorption is calcinated again through the hot calendering at a high temperature under high pressure and is in tight contact with and fixed to the fixing hole of the supporting plate 12. Then, the upper and lower surfaces, the outer circumference, the gas hole, and the like of the joint bodies are subjected to machining, thereby making the first ceramic plate 10.

In a case where the first ceramic plate 10 has the bank portion 18 surrounding the second surface 10b and has the second recess portion 17 due to the bank portion 18, the second surface 10b of the first ceramic plate 10 is cut through rotary cutting or the like, and the second recess portion 17 can be prepared.

The adhesive layer 21 such as a polyimide resin and the like is stuck in a predetermined region of the second surface 10b of the first ceramic plate 10.

On the adhesive layer 21, a nonmagnetic metal thin plate such as a titanium (Ti) thin plate, a tungsten (W) thin plate, a molybdenum (Mo) thin plate, and the like, for example, having a thickness of 0.2 mm or less, preferably a uniform thickness of 0.1 mm or less is stuck. The nonmagnetic metal thin plate is subjected to etching in a desired heater pattern through a photolithographic method, thereby making the heating member 20.

Accordingly, the heating member 20 having the desired heater pattern is formed on the second surface 10b of the first ceramic plate 10.

Subsequently, the second ceramic plate 40 is prepared. For example, an alumina ($Al_2O_3$) sintered body is caused to have a plate shape, and the second ceramic plate 40 is prepared. In this case, aluminum oxide powder is formed in a desired shape. Thereafter, calcination is performed for a predetermined time, and the second ceramic plate 40 can be obtained.

In the second ceramic plate 40, a penetration hole for inserting the first extraction electrode 15C of the internal electrode terminal 15 and the power supply terminal 22 is formed. In regard to the size of the penetration hole, the preparation is performed so as to realize the size and the shape in which the first extraction electrode 15C and the power supply terminal 22 can be in tight contact with and fixed to each other. As the method of preparing the first extraction electrode 15C and the power supply terminal 22, for example, in a case where the power supply terminal 22 is made of the conductive composite sintered body, a method in which the conductive ceramic powder is formed in a desired shape and subjected to pressurization calcination, and the like can be exemplified.

In a case where the second ceramic plate 40 is divided into a plurality members via the heat insulating layer 41, the preparation can be performed in the procedure as follows. A plate made of the same material as the second ceramic plate 40 is prepared, an irregular shape is formed on the surface thereof through end milling, blasting, and the like. The recess portion of the formed irregular shape is filled with a material configuring the heat insulating layer 41 and is cured.

Thereafter, the plate is cut along the bottom surface of the recess portion, and the second ceramic plate 40 which is divided into a plurality of members via the heat insulating layer 41 can be prepared.

In addition, in a case where the auxiliary heating member 70 is prepared on the one surface 40a of the second ceramic plate 40 on the first ceramic plate 10 side, the preparation can be performed in the procedure as follows.

First, the energization wiring 76 is formed any one surface of the second ceramic plate 40. Forming of the energization wiring 76 is not particularly limited and can be realized by performing vapor deposition, sputtering, or the like of a metal film via a mask. In addition, pattern etching may be performed after performing vapor deposition, sputtering, or the like.

Subsequently, the adhesive layer (the insulative layer) 71 such as a polyimide resin and the like is stuck. Thereafter, after the hole is open at a place corresponding to the connection portion 78 of the adhesive layer 71, metal which becomes the heat generation wiring 77 is subjected to vapor deposition, sputtering, or the like via the mask. The energization terminal 74 and the lead terminal 72 can be prepared through a method similar to the power supply terminal 22.

Moreover, in the electrostatic chucking device, in a case where the ceramic plate 90 is further interposed between the second ceramic plate 40 and the cooling base portion 60, it is preferable that the ceramic plate 90 is adhered to one surface of the second ceramic plate 40 via the adhesive layer 91 in advance.

Subsequently, the first ceramic plate 10 to which the heating member 20 is adhered and the second ceramic plate 40 are adhered to each other. In addition, the lead electrode 15A and the first extraction electrode 15C are electrically connected to each other by the first conductive adhesive material 15B.

Before these are adhered to each other, it is preferable that the spacer 31 is disposed on the surface of the joined heating member 20, and the gap between the first ceramic plate 10 and the second ceramic plate 40 is set in advance. The second surface 10b of the first ceramic plate 10 after the spacer 31 is disposed, for example, is coated with a material configuring the first adhesive layer 30 made of a polyimide resin. After performing coating with the material configuring the first adhesive layer 30, the one surface 40a of the second ceramic plate 40 is pressed and heated. The material configuring the first adhesive layer 30 is cured due to the heating, and the first adhesive layer 30 is formed. In this manner, a member in which the first ceramic plate 10 and the second ceramic plate 40 are adhered to each other in a state of having the heating member 20 therebetween is prepared.

Meanwhile, a metal material made of aluminum (Al), an aluminum alloy, copper (Cu), a copper alloy, stainless steel (SUS) or the like is subjected to machining. As necessary, the flow channel or the like for causing the refrigerant to flow is formed inside the metal material, and the cooling base portion 60 is prepared.

It is preferable that at least the surface of the cooling base portion 60 exposed to plasma is subjected to alumite treatment or an insulative film such as alumina and the like is formed thereon.

Subsequently, in the cooling base portion 60, a penetration hole for inserting a second lead electrode 15E of the internal electrode terminal 15, the power supply terminal 22, the energization terminal 74, and the lead terminal 72 is formed.

In a case where the cooling base portion 60 has the first recess portion 61, similar to the second recess portion 17 of the first ceramic plate 10, the first recess portion 61 can be prepared by cutting through rotary grinding or the like.

Lastly, one surface of the cooling base portion 60 is coated with the second adhesive layer 50, and a member in which the first ceramic plate 10 and the second ceramic plate 40 already formed on the coated surface are adhered to each other in a state of having the heating member 20 therebetween is pressed and heated, thereby curing the material configuring the second adhesive layer 50. Then, these can be adhered to each other. In addition, the first extraction electrode 15C and the second extraction electrode 15E are electrically connected to each other by the second conductive adhesive material 15D.

EXAMPLE

Hereinafter, the effect of the present invention will be clearer through Example. The present invention is not limited to the following Example and can be executed by being suitably changed within a range in which the gist thereof is not changed.

An electrostatic chucking device of Example has a configuration similar to the electrostatic chucking device 1 of the first embodiment illustrated in FIG. 1.

The first ceramic plate, the heating member, and the second ceramic plate have circular shapes and have diameters of 300 mm. The cooling base portion has a circular shape and has a diameter of 400 mm.

As the first ceramic plate, a composite sintered body of aluminum oxide-silicon carbide ($Al_2O_3$—SiC) is used. The thickness of the ceramic plate is 3 mm. As the heating member, a titanium (Ti) thin plate including a plurality of members which are separated and independent from each other is used. In regard to the thickness, the heating member has a thickness of 0.1 mm.

In a case where the heating member is heated to a temperature of 300° C., the temperature range which can be taken by each of the members when heat generated due to the heating is transferred to the cooling base portion is obtained by calculating the heat transfer.

In this case, the electrostatic chucking device has the configuration in which the first adhesive layer, the second ceramic plate, the third adhesive layer, the second adhesive layer, and the cooling base portion are arranged from the heating member side, and cooling water is caused to pass through the opposite side of the heating member of the cooling base portion by using a chiller (illustration omitted).

As the first adhesive layer, a polyimide resin is used. As the second ceramic plate, an alumina ($Al_2O_3$) plate is used. As the third adhesive layer, a polyimide sheet is used. As the second adhesive layer, a silicone resin is used. As the cooling base member, aluminum is used. In addition, the temperature of the heating member is set to 300° C., and the temperature of the chiller is set to 100° C. Since the first ceramic plate does not significantly affect the temperature between the heating member and the cooling base portion, thereby being ignored.

In regard to the thickness of each of the members, the first adhesive layer is set to 0.2 mm, the second ceramic plate is set to 1.5 mm, the third adhesive layer is set to 0.1 mm, the second adhesive layer is set to 0.2 mm, and the cooling base portion is set to 5.0 mm. In this case, by using the heat transfer coefficient per unit area of each of the members, the temperature which can be taken by each of the members when heat is transferred to the cooling base portion is calculated and is shown in Table 1.

TABLE 1

| | Configuration material | Thermal conduction coefficient (W/mK) | Film thickness (mm) | Temperature (° C.) |
|---|---|---|---|---|
| Heating member | | | | 300 |
| First adhesive agent | Polyimide | 0.18 | 0.2 | 195~300 |

TABLE 1-continued

| | Configuration material | Thermal conduction coefficient (W/mK) | Film thickness (mm) | Temperature (° C.) |
|---|---|---|---|---|
| Second ceramic plate | Alumina | 30 | 1.5 | 190~195 |
| Third adhesive agent | Polyimide | 0.18 | 0.1 | 164~190 |
| Second adhesive agent | Silicone | 0.40 | 0.2 | 116~164 |
| Cooling base portion | Aluminum | 130 | 5 | 113~116 |
| Chiller | | | | 100 |

As shown in Table 1, even if the temperature of the heating member is 300° C., it is found that the temperature of the second adhesive layer is low ranging from 116° C. to 164° C.

Hereinbefore, various types of embodiments of the present invention have been described. However, each of the configurations, combinations thereof, and the like in each of the embodiments are examples. Addition, omission, replacement, and other changes of the configurations can be made within the scope not departing from the gist of the present invention. In addition, the present invention is not limited to the embodiments.

REFERENCE SIGNS LIST 1, 2, 3, 4, 5 . . . ELECTROSTATIC CHUCKING DEVICE,
10 . . . FIRST CERAMIC PLATE,
10a . . . FIRST SURFACE, 10b . . . SECOND SURFACE,
11 . . . PLACEMENT PLATE,
12 . . . SUPPORTING PLATE,
13 . . . INTERNAL ELECTRODE FOR ELECTROSTATIC ADSORPTION,
14 . . . PROJECTION PORTION,
15 . . . INTERNAL ELECTRODE TERMINAL, 15A . . . LEAD ELECTRODE, 15B . . . FIRST CONDUCTIVE ADHESIVE MATERIAL, 15C . . . FIRST EXTRACTION ELECTRODE, 15D . . . SECOND EXTRACTION ELECTRODE,
16 . . . INSULATOR,
17 . . . SECOND RECESS PORTION,
18 . . . BANK PORTION, 18a . . . SURFACE OF BANK PORTION ON COOLING BASE SIDE,
20 . . . HEATING MEMBER,
21 . . . ADHESIVE LAYER,
22 . . . POWER SUPPLY TERMINAL,
23 . . . INSULATOR,
30 . . . FIRST ADHESIVE LAYER,
31 . . . SPACER,
40 . . . SECOND CERAMIC PLATE, 40a . . . ONE SURFACE, 40b REAR SURFACE,
50 . . . SECOND ADHESIVE LAYER,
60 . . . COOLING BASE PORTION,
61 . . . FIRST RECESS PORTION,
70 . . . AUXILIARY HEATING MEMBER,
71 . . . ADHESIVE LAYER (INSULATIVE LAYER),
72 . . . LEAD TERMINAL,
73 . . . INSULATOR,
74 . . . ENERGIZATION TERMINAL,
75 . . . INSULATOR,
76 . . . ENERGIZATION WIRING,
77 . . . HEAT GENERATION WIRING,
78 . . . CONNECTION PORTION,
80 . . . THIRD ADHESIVE LAYER,
90 . . . CERAMIC PLATE, AND
91 . . . ADHESIVE LAYER

The invention claimed is:

1. An electrostatic chucking device comprising:
a first ceramic plate in which an internal electrode for electrostatic adsorption is embedded, which comprises a first surface on which the plate-shaped sample is to be placed, and
a second surface on the opposite side of the first surface;
a heating member fixed to the second surface;
a second ceramic plate adhered to the first ceramic plate and the heating member via a first adhesive layer; and
a cooling base portion bonded to the second ceramic plate via a second adhesive layer,
wherein the first adhesive layer has a higher heat resistance than the second adhesive layer, and
the second adhesive layer has a smaller Young's modulus than the first adhesive layer,
the first ceramic plate has a bank portion surrounding the second surface, and
the second ceramic plate is fitted, via the first adhesive layer, in a second recess portion formed by the bank portion and the second surface.

2. The electrostatic chucking device according to claim 1, wherein the first and second adhesive layers have heat transfer coefficients which are ½ or less of the heat transfer coefficient of the second ceramic plate.

3. The electrostatic chucking device according to claim 1, wherein the cooling base portion has a first recess portion, and
at least the first adhesive layer and the second ceramic plate are fitted in the first recess portion.

4. The electrostatic chucking device according to claim 1, wherein the first ceramic plate is made of at least one sintered body selected from the group consisted of a composite sintered body of aluminum oxide-silicon carbide, a sintered body of aluminum oxide, a sintered body of aluminum nitride, and a sintered body of yttrium oxide.

5. The electrostatic chucking device according to claim 1, wherein a plurality of auxiliary heating members are fixed to a surface of the second ceramic plate wherein the surface of the second ceramic plate is on the side of the first ceramic plate, and
a temperature of each of the auxiliary heating members is able to be individually controlled.

6. The electrostatic chucking device according to claim 1, wherein the heating member comprises a plurality of separated members, and
each temperature of the separated members is able to be individually controlled.

7. The electrostatic chucking device according to claim 6, wherein the second ceramic plate is divided heat-conductively in accordance with a region in which a temperature of each of the separated heating members is able to be individually controlled.

8. The electrostatic chucking device according to claim 1, wherein a third adhesive layer is interposed between the second ceramic plate and the second adhesive layer, and
the third adhesive layer has a higher heat resistance than the second adhesive layer.

9. The electrostatic chucking device according to claim 1, wherein one or more ceramic plates are interposed between the second ceramic plate and the second adhesive layer.

\* \* \* \* \*